United States Patent [19]

Boyle

[11] 4,439,727

[45] Mar. 27, 1984

[54] LOW CAPACITANCE PAD FOR SEMICONDUCTOR CHIP TESTING

[75] Inventor: David H. Boyle, Manassas, Va.

[73] Assignee: IBM Corporation, Armonk, N.Y.

[21] Appl. No.: 332,707

[22] Filed: Dec. 21, 1981

[51] Int. Cl.³ ............................................. G01R 1/06
[52] U.S. Cl. ............................... 324/158 R; 324/73 R
[58] Field of Search ........... 324/158 R, 158 T, 158 D, 324/128, 73 R

[56] References Cited

U.S. PATENT DOCUMENTS

| | | | |
|---|---|---|---|
| 3,801,910 | 4/1974 | Quinn | 324/158 R |
| 3,995,175 | 11/1976 | Hoyt et al. | |
| 4,176,258 | 11/1979 | Jackson | 324/73 R |
| 4,364,010 | 12/1982 | Watari et al. | 324/158 T |

FOREIGN PATENT DOCUMENTS 2090986  7/1982  United Kingdom .

OTHER PUBLICATIONS

*IBM Tech. Dis. Bulletin*, "Chip Power Test Circuit" by W. Klein et al., vol. 22, No. 8A, Jan. 1980, pp. 3256–3257.

*Primary Examiner*—Stewart J. Levy
*Attorney, Agent, or Firm*—John E. Hoel

[57] ABSTRACT

A low capacitance pad structure is disclosed for testing a semiconductor chip, so as to enable the accurate measurement of rise times and delays in internal logic circuitry. The structure provides a capacitive coupling between the internal logic circuit under test and the capacitance of the probe connected to the input/output pad of the chip. This is achieved by inserting a coupling capacitance between the internal logic circuit and the input/output pad. The coupling capacitance is formed by providing a thin dielectric layer on top of an enlarged plate portion of the conductor line connected to the output of the internal logic circuit under test, so as to capacitively couple voltage swings on the line to a second level plate which forms the electrode to be contacted by the test probe. The capacitively coupled output pad enables the accurate characterization of the rise times and delay times of internal logic circuitry on an integrated circuit semiconductor chip, which would not be otherwise conveniently measurable.

6 Claims, 7 Drawing Figures

LOW CAPACITANCE PAD FOR SEMICONDUCTOR CHIP TESTING

FIELD OF THE INVENTION

The invention disclosed broadly relates to semiconductor devices and more particularly relates to testing structures for large scale integrated circuits.

BACKGROUND OF THE INVENTION

Internal logic circuits on a large scale integrated circuit chip characteristically have a relatively low output capacitance and are generally incapable of driving the large capacitive loads presented by a normal I/O pad and testing instrumentation. For example, FIG. 1 illustrates a prior art attempt at a direct connection of a probe having a characteristic capacitance to ground $C_t$ of approximately 20 pf when in contact with a conventional metal I/O pad having a dimension of approximately 100 microns by 100 microns on a side. The capacitance to ground of such a pad would be approximately 0.5 pf. An internal circuit such as a NAND, NOR or other logic function is normally connected to an output line having a characteristic capacitance to ground $C_L$ of approximately 0.5 pf. As is seen in FIG. 1, if the internal logic circuit attempts to drive the combination of the output line capacitance $C_L$, the conventional pad capacitance $C_p$ and the probe capacitance $C_t$, the total capacitance which must be driven by the internal circuit is greater than 20 pf. Since this total capacitance far exceeds the normal load capacitance for which an internal circuit is designed in its normal operating environment, the rise time and delay times for signals output by the internal circuit under test are extremely distorted.

Another approach in the prior art to solving this testing problem is the inclusion of an off chip driver (OCD) circuit between the internal logic circuit and the output pad. However, for testing the rise time or delay times of signals from the internal logic circuit, an OCD circuit confuses the measurement since an OCD typically has greater than three times the time delay of an internal logic circuit. This approach obliterates the rise time and fall time of the internal logic circuit.

OBJECTS OF THE INVENTION

It is therefore an object of the invention to provide a means for accurately measuring the rise times and delays in internal logic circuitry of large scale integrated circuit chips.

It is still another object of the invention to minimize the effects of probe capacitance in testing the internal circuitry of large scale integrated circuit chips.

SUMMARY OF THE INVENTION

These and other objects, features and advantages of the invention are accomplished by the low capacitance pad for semiconductor chip testing disclosed herein. A low capacitance pad structure is disclosed for testing a semiconductor chip, so as to enable the accurate measurement of rise times and delays in internal logic circuitry. The structure provides a capacitive coupling between the internal logic circuit under test and the capacitance of the probe connected to the input/output pad of the chip. This is achieved by inserting a coupling capacitance between the internal logic circuit and the input/output pad. The coupling capacitance is formed by providing a thin dielectric layer on top of an enlarged plate portion of the conductor line connected to the output of the internal logic circuit under test, so as to capacitively couple voltage swings on the line to a second level plate which forms the electrode to be contacted. The capacitively coupled output pad enables the accurate characterization of the rise times and delay times of internal logic circuitry on an integrated circuit semiconductor chip, which would not be otherwise conveniently measurable.

DESCRIPTION OF THE FIGURES

These and other objects, features and advantages of the invention will be more fully appreciated with reference to the accompanying figures.

DISCUSSION OF THE PREFERRED EMBODIMENT

Figure 2:
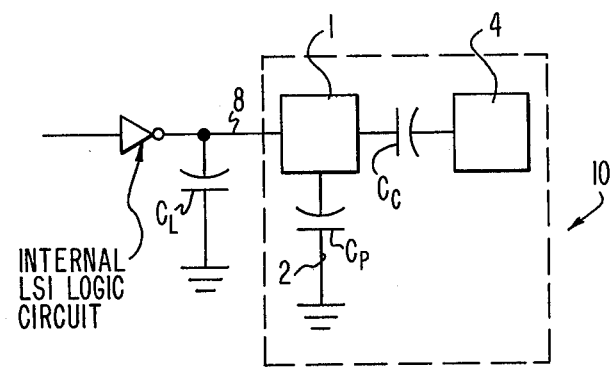
FIG. 2 is a schematic diagram of the equivalent electrical elements in the low capacitance pad for a semiconductor chip testing invention.
Figure 3:
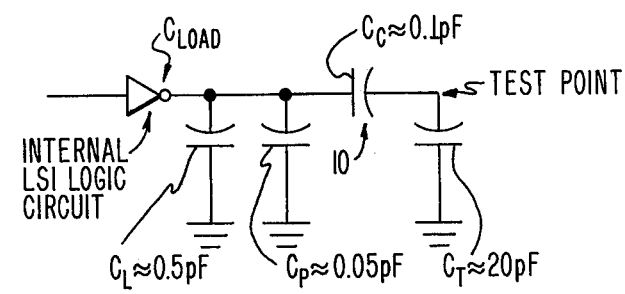
FIG. 3 is another schematic diagram of the equivalent electrical elements of the invention.

The invention disclosed here overcomes the above-recited problems of the prior art by providing a capacitive coupling pad 10 between the internal logic circuit under test and the capacitance of the probe connected to the I/O pad. This is achieved as is shown in schematic form in FIG. 2 wherein a coupling pad 10 having a capacitance $C_c$ is inserted in series between the internal logic circuit and the probe contact. The equivalent circuit for this connection is shown in FIG. 3. The coupling pad 10 is formed by providing a thin dielectric layer on top of an enlarged plate portion 1 of the conductor line 8 connected to the output of the internal logic circuit under test, so as to capacitively couple voltage swings on the line 8 to a second level plate 4 which forms the electrode to be contacted by the test probe. This is achieved by the structure shown in plan view in FIG. 4 and in cross-sectional view in FIG. 5.

Figure 5:
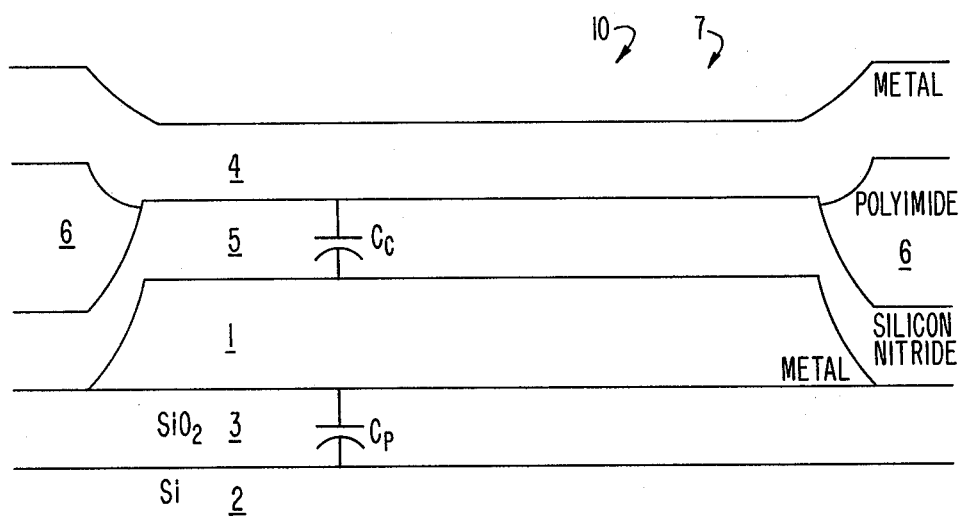
FIG. 5 is a side cross-sectional view along the section line 5—5' of FIG. 4, of the low capacitance pad for semiconductor chip testing.

As is seen in the cross-sectional view of FIG. 5, a lower plate 1 of approximately 30 microns on a side, which may be either metal or polycrystalline silicon or other suitable conductor, is formed on the surface of the insulating layer 3 of silicon dioxide, which in turn has been formed on the surface of the silicon substrate 2. The lower plate has a capacitance $C_p$ with respect to the silicon substrate 2 of approximately 0.048 pf.

Formed over the surface of the lower plate 1 is a layer of silicon nitride 5 having a characteristic dielectric constant of approximately 7 and a thickness of approximately 7000 Å layer of polyimide which can serve as a passivation layer over the greater portion of the semiconductor chip, has a via hole 7 formed therein to enable a high capacitance per unit area structure to be formed by allowing the close approach of the upper plate 4. The upper plate 4 is the second level of a double level conductive layer interconnection network and can be either metal or polycrystalline silicon. The coupling capacitance $C_c$ between the upper plate and the lower plate 1 through the silicon nitride layer 5 is approximately 0.09 pf. The upper plate 4 can have peripheral dimensions of 50 microns on a side or greater, as desired for convenience in probing.

Figure 4:
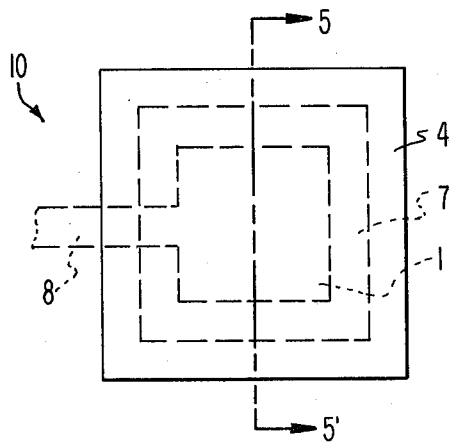
FIG. 4 is a top view of the layout of the low capacitance pad for a semiconductor chip testing.

Referring now to FIG. 3, the equivalent circuit for the capacitively coupled testing pad 10 shown in FIGS. 4 and 5 can be seen. The total load capacitance $C_{load}$ seen at the output of the internal logic circuit whose rise time or delay characteristics are to be measured, is the sum of $C_L$, $C_p$ and C where C is the equivalent capacitance of the series connected coupling capacitance $C_c$ and probe capacitance $C_t$. The value of C is approximately 0.1 pf and therefore the load capacitance is approximately 0.65 pf.

Figure 1:
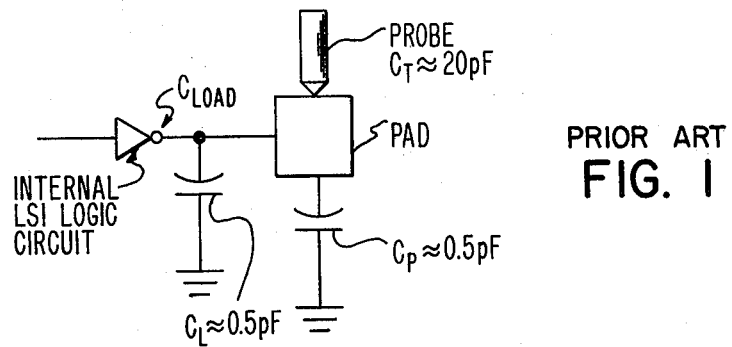
FIG. 1 is a schematic diagram of the prior art technique for directly connecting a testing probe to a semiconductor chip pad.

As can be seen, there is a dramatic improvement in the load capacitance $C_{load}$ at the output node of the internal logic circuit under test between the value of greater than 20 pf for the prior art circuit of FIG. 1 and the value of approximately 0.65 pf for the inventive circuit shown in FIGS. 2 through 5. The capacitively coupled output pad 10 enables the accurate characterization of the rise times and delay times of internal logic circuitry on an integrated circuit semiconductor chip, which would not otherwise be conveniently measurable.

The capacitively coupled I/O pad 10 disclosed herein can also be employed as a low delay clock-pulse output pad for those applications requiring minimum skew between the time of occurrence of clock pulses and the time of occurrence of other events being clocked.

It can be appreciated from the equivalent circuit shown in FIG. 3 that a capacitive voltage divider is formed by the capacitance $C_c$ and the capacitance $C_t$ with respect to the test point so that the actual measured voltage $V_{out}$ is proportional to the ratio of $C_c/C_t$ and therefore a limit to the size of the probe $C_t$ is the voltage sensitivity of the test equipment connected to the test point. In typical applications where the output voltage swing for the internal logic circuitry is approximately 5 volts, and the ratio of $C_c$ to $C_t$ is 1/200, a 25 millivolt value for $V_{out}$ will be present at the test point and this can be easily measured by conventional test equipment.

It is seen from the equivalent circuit shown in FIG. 3 that the measurability of the characteristics of the internal logic circuit is not sensitive to the absolute magnitude of $C_t$ or $C_c$ and therefore critical tolerances need not be observed with respect to the formation of the coupling capacitor $C_c$ including the overall dimensions of the upper plate 4, the lower plate 1 or the dielectric coupling medium 5. Still further, the capacitance of the testing probe $C_t$ can vary over a wide margin without materially affecting the accuracy of the measurement characterization for the internal logic circuit.

The low capacitance pad 10 for semiconductor chip testing enables the accurate characterization of the rise times and delay times of internal logic circuitry on an integrated circuit chip, which cannot otherwise be conveniently measured. Furthermore, the capacitance of the testing probe can vary over a wide margin without materially affecting the accuracy of the measurement characterization for the internal logic circuit.

Figure 6:
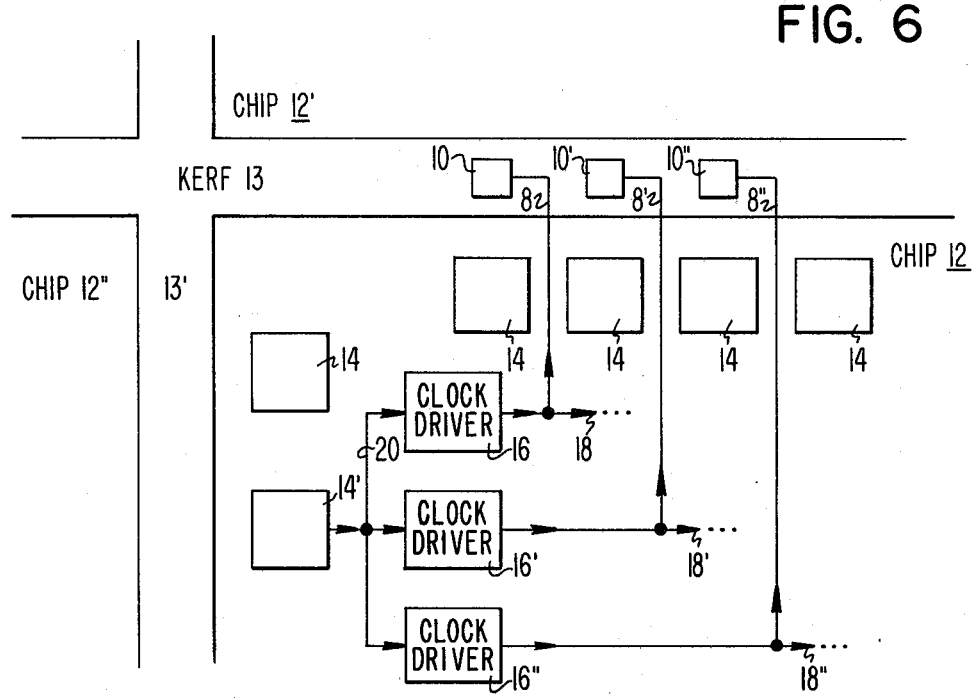
FIG. 6 is a plan view of a semiconductor wafer with a plurality of chips, each having multiple clock driver circuits whose delay characteristics must be monitored by the low capacitance pad invention, while they are being adjusted.
Figure 7:
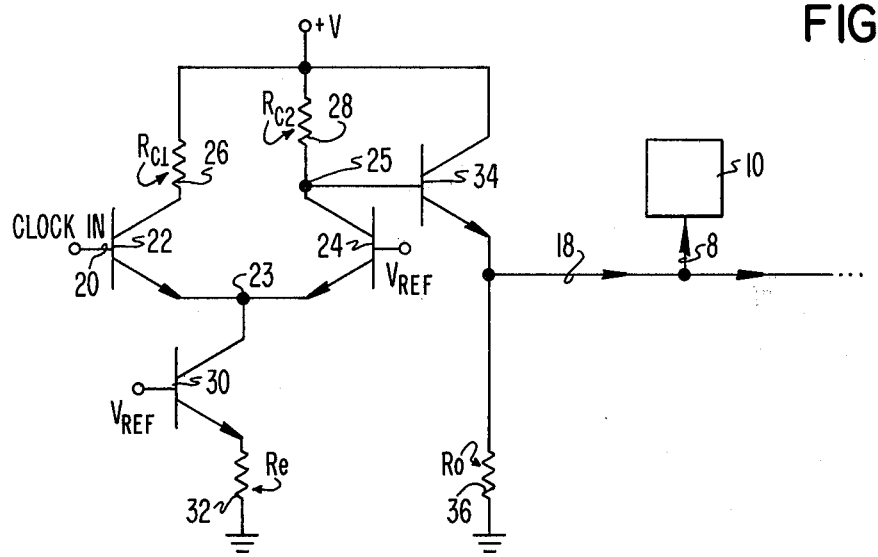
FIG. 7 is a schematic circuit diagram of a clock driver circuit in FIG. 6, incorporating the low capacitance pad invention.

An application of the low capacitance pad invention for tailoring the delay characteristics of multiple clock drivers on an LSI chip can be illustrated with FIGS. 6 and 7. FIG. 6 is a plan view of a semiconductor wafer with the plurality of chips 12, 12' and 12", each chip 12 having multiple clock driver circuits 16, 16' or 16", such as is shown in FIG. 7.

Typically, all large scale integrated circuits which perform digital operations require clocking which is derived from an external clock pulse source whose input clock signal is applied to the LSI chip pad 14'. Clocking is required throughout the LSI chip and a single clock driver circuit 16 would be incapable of driving all of the circuits which require it throughout the chip. Therefore, several clock driver circuits 16 are typically embodied on an LSI chip, all of which derive their clock triggering signal from the same input pad 14'.

The problem which occurs in having multiple clock drivers is that their delay characteristics will vary from one to another due to variable process parameters across the chip and from one chip to another, and variable capacitive loading, such as in a tree network. By providing the low capacitance pad invention as described above, for each clock driver circuit 16, the delay characteristics of the clock driver circuit 16 can be tailored to meet any desired specification and can be matched or selectively skewed with the characteristics of companion clock driver circuits 16' and 16" on the same semiconductor chip. As is shown in FIG. 6, the low capacitance pad 10 can be connected to the output line 18 of the clock driver circuit 16 by means of the line 8 so that a test probe can be brought into contact with the pad 10 to enable the monitoring of the clock driver's characteristics while carrying out functional trimming operations on the components of the clock driver circuit 16.

As is seen in FIG. 6, the low capacitance pads 10, 10' and 10" can be located in the kerf portion 13 between the chips 12 and 12' on the semiconductor wafer, and their respective conductor lines 8, 8' and 8" would pass between the peripheral contact pads 14 of the chip 12 and respectively connect with the output lines 18, 18' and 18" of the respective driver circuits 16, 16' and 16". In this manner, the low capacitance pads 10, 10' and 10" would not occupy space on the final chip 12 after the chip 12 had been severed from the wafer by cutting along the kerf 13 and 13'.

A typical clock driver circuit 16 which can be adjusted by a conventional functional trimming operation, is shown in FIG. 7. The circuit is an emitter coupled logic clock driver having a first NPN bipolar transistor 22 with its base connected to the clock input line 20 which is connected to the input pad 14'. The collector of transistor 22 is connected through the resistor 26 to the +V potential and the emitter of transistor 22 is connected to the common emitter node 23, for which transistor 30 and resistor 32 serve as a constant current source. A second NPN bipolar transistor 24 has its emitter connected to the common emitter node 23, its base connected to a reference potential VREF, and its collector connected through the thin film resistor 28 to +V. The node 25 at the collector of the transistor 24 is connected to the base of the NPN bipolar transistor 34. The collector of transistor 34 is connected to +V and the emitter of transistor 34 is connected through the thin film resistor 36 to ground potential. The emitter of transistor 34 is also connected to line 18 and serves as the clock pulse driver output line to the utilization circuitry on the chip. Also connected to the output line 18 is the line 8 which couples the driver 16 to the low capacitance pad 10.

The node 23 and the driver circuit 16 has its voltage follow the voltage transitions of the input clock waveform on line 20 to the transistor 22. As is the case in conventional emitter coupled logic circuitry, when the input clock waveform on line 20 rises, the node 23 also rises, turning off the transistor 24 and thereby raising the potential at the node 25 at a rate which is determined by the RC time constant of the resistance $R_{C2}$ of the resistor 28 and the capacitance of the collector base junction of the transistor 24. The rise time of the waveform at the node 25 can be reduced or made faster by reducing the magnitude of the resistance $R_{C2}$ of the resistor 28. Since the output line 18 from the transistor 34 follows the waveform at the node 25, the rise time of the clock pulse output on line 18 by the clock driver 16 can be adjusted by adjusting the resistance $R_{C2}$ of the resistor 28. If the resistor 28 is formed as a thin film resistor which can be functionally trimmed by a laser trimming technique, for example, then the rise time of the clock waveform output by the driver 16 on line 18 can be accurately monitored during the trimming process by means of applying a tester probe to the low capacitance pad 10 connected to the output line 18. Active trimming of thin film resistors directly on the silicon chip has been described for example by S. Harris, et al., "Laser Trimming on the Chip," *Electronic Packaging and Production,* February 1975, pages 50–56. Harris, et al. describe a silicon-chromium film medium for the thin film resistor to be trimmed, which can be trimmed in a conventional laser trimming apparatus.

The fall time of the clock waveform output on line 18 by the clock driver 16 in FIG. 7, depends upon the RC time constant of the resistance $R_0$ of resistor 36 and the capacitance of the load driven by the output line 18. That fall time can be made shorter or faster by reducing the magnitude $R_0$ of the resistor 36. Thus, the resistor 36 is also formed as a thin film resistor and can be actively trimmed to adjust the fall time for the clock waveform, in a manner similar to that described for the resistor 28.

It should of course be recognized that other types of circuits besides the emitter coupled logic circuit shown in FIG. 7 would be suitable for a clock driver whose output can be monitored while waveform adjustments are made, by employing the low capacitance pad invention. Still further, other types of circuits whose waveform characteristics are critical to an application can be monitored by means of the low capacitance pad invention.

Although a specific embodiment of the invention has been disclosed, it will be understood by those of skill in the art that the foregoing and other changes in form and details may be made therein, without departing from the spirit and the scope of the invention.

Having thus described our invention, what we claim as new, and desire to secure by Letters Patent is:

1. A capacitively coupled contact pad on a large scale integrated circuit chip, comprising:
    a semiconductor substrate including a circuit network having an input/output node, said substrate having a first insulating layer deposited thereon as part of said chip;
    a lower conductive plate formed on the surface of said first insulating layer as part of said chip and in conductive contact with said node;
    a second insulating layer deposited on said lower plate as part of said chip;
    an upper conductive plate formed on the surface of said second insulating layer as part of said chip and juxtaposed with said lower plate, said second insulating layer forming a dielectric medium through which said upper plate is capacitively coupled with said lower plate;
    whereby input/output signals can be transferred between said upper and lower plates by capacitively coupling through said second insulating layer.

2. A capacitively coupled testing pad on a large scale integrated circuit chip, comprising;
    a semiconductor substrate including a circuit network having a node to be tested, said substrate having a first insulating layer deposited thereon as part of said chip;
    a lower conductive plate formed on the surfact of said first insulating layer as part of said chip and in conductive contact with said node;
    a second insulating layer deposited on said lower plate as part of said chip;
    an upper conductive plate formed on the surface of said second insulating layer as part of said chip, juxtaposed with said lower plate and adapted to contact a test probe connected to a test instrument, said second insulating layer forming a dielectric medium through which said upper plate is capacitively coupled with said lower plate;
    whereby test signals can be transferred between said test probe and said circuit to be tested by capacitively coupling through said second insulating layer.

3. The capacitively coupled testing pad of claim 2, which further comprises:
    said testing pad being located in the kerf region of a semiconductor wafer, with a conducting line connecting said lower conductive plate to a circuit within a semiconductor chip area adjacent to said kerf region, whose characteristics are to be tested.

4. The capacitively coupled testing pad of claim 3, which further comprises:
    said circuit whose characteristics are to be tested being a clock driver circuit.

5. The capacitively coupled testing pad of claim 4, which further comprises:
    said clock driver circuit to be tested including actively trimmable elements for adjusting the characteristics of the clock driver circuit.

6. The capacitively coupled testing pad of claim 5, which further comprises:
    said actively trimmable elements being thin film resistors which can be trimmed by laser trimming techniques to adjust their resistance.

* * * * *